United States Patent [19]
Price

[11] 3,988,617
[45] Oct. 26, 1976

[54] FIELD EFFECT TRANSISTOR BIAS CIRCUIT

[75] Inventor: Cyrul Arthur Price, Kingston, N.Y.

[73] Assignee: International Business Machines Corporation, Armonk, N.Y.

[22] Filed: Dec. 23, 1974

[21] Appl. No.: 535,394

[52] U.S. Cl. ............................. 307/270; 307/204; 307/214; 307/246; 307/251; 307/DIG. 4
[51] Int. Cl.² ................. H03K 17/60; H03K 19/08; H03K 19/40; H03K 3/353
[58] Field of Search .......... 307/205, 214, 270, 246, 307/269, 304, 251, DIG. 4; 328/176

[56] References Cited
UNITED STATES PATENTS

| | | | |
|---|---|---|---|
| 3,735,277 | 5/1973 | Wanlass | 307/251 X |
| 3,774,055 | 11/1973 | Bapat | 328/176 X |
| 3,808,468 | 4/1974 | Ludlow et al. | 307/304 |
| 3,825,771 | 7/1974 | Boll | 307/205 X |

OTHER PUBLICATIONS

Simi, "Field–Effect Transistor Drive Circuit;" *IBM Tech. Discl. Bull.;* vol. 17, No. 4, p. 1120; Sept. 1974.

*Primary Examiner*—John S. Heyman
*Assistant Examiner*—Larry N. Anagmos

[57] ABSTRACT

A field effect transistor amplifier having a bootstrap bias voltage circuit which is isolated from the output. Isolation of the bootstrap bias voltage circuit allows a plurality of amplifiers to be connected in series to provide a higher bootstrap bias voltage than could be provided by a single bootstrap bias voltage circuit.

8 Claims, 6 Drawing Figures

3,988,617

FIELD EFFECT TRANSISTOR BIAS CIRCUIT

BACKGROUND OF THE INVENTION

1. Field of the Invention

The invention relates to digital field effect transistor amplifier circuits which provide an output signal level substantially equal to the power supply voltage for use in connecting one or more field effect transistor gating circuits to a large plurality of other field effect transistor gating circuits or for connecting field effect transistor gating circuits to a long circuit network having a large distributed signal conductor to reference conductor capacitance.

2. Description of the Prior Art

FIG. 1 shows a simple inverter circuit embodied in field effect transistors having a load FET 11 connected to operate as a load resistor for providing a binary up level voltage and a switching FET 13 which is operated in the triode region when a positive voltage signal A is present at its gate to provide a binary zero level voltage by having a conductivity substantially greater than the conductivity of FET 11. The greater conductivity is provided by making the channel region of FET 13 five times as wide as it is long. If FET 11 and FET 13 were P-type field effect transistors, operable with a negative gate voltage signal, and connected to a negative power supply, a binary up level voltage would be negative. Because FET 11 is nonlinear, only negligible currents will flow through FET 11 until a gate to source threshold voltage $Vth$ is exceeded. The output signal $\overline{A}$ therefore swings from nearly ground reference voltage to an upper binary voltage of +8 volts minus $Vth$ where $Vth$ is the threshold voltage. $Vth$ is fully defined in "MOSFET in Circuit Design" by Robert H. Crawford, Copyright 1967, by Texas Instruments, Inc.

In order to provide an output voltage equal to +8 volts, FET 11 must be provided with a gate voltage substantially higher than +8 volts. The higher gate voltage has been provided in the prior art by a separate power supply or by a self-charging bootstrap capacitor circuit such as shown in FIG. 2.

One problem with the ordinary self-charging bootstrap capacitor circuit such as is shown in FIG. 2 is that node 29 of FIG. 2 has no discharge path other than ordinary leakage current paths and, therefore, whenever FET 23 is turned on, it must draw current from FET 21 as well as the output circuit net capacitance discharging current. Furthermore, the resistivity of FET 21 is much lower than was the resistivity of FET 11 of FIG. 1 because FET 21 has a much higher gate voltage. The current $Id$ through an FET is proportional to $(Vg-Vth)^2$ where $Vg$ is the gate voltage. The increased current allows the output voltage at NODE 31 to rise much faster. Because FET 23 must carry both of these currents, the voltage at the output node 31 will drop slowly when FET 23 is turned on unless a relatively large FET 23 is provided. In the example of FIG. 2, bootstrap load devices 21 and 25 are shown having a width to length ratio of one to one. In other words, the width of the channel regions of these field effect transistors is approximately equal to the length of the channel regions. On the other hand, the width of the channel regions of FET 23 is only five times the length of its channel region to provide the normally lower resistivity when a signal voltage A is present at its gate input. To decrease output signal fall time, a ratio of greater than five to one will be required.

If a discharge device is provided to discharge the bootstrapped node such as FET 33 connected between ground reference potential and node 29, both sides of the bootstrap capacitor 27 can be simultaneously discharged allowing a faster output signal fall time without increasing the width to length ratio of the switching transistor FET 23. The use of a discharge FET 33 in conjunction with the ordinary bootstrap capacitor bias circuit as shown in FIG. 2 will not work in those applications where it is desired to selectively render switching device 23 conductive unless discharge device 33 is simultaneously rendered conductive and, furthermore, is not rendered conductive at any other times. If discharge FET 33 is rendered conductive to discharge node 29, the output net capacitance of node 31 will be also partially discharged by the voltage divider effect between the output net capacitance and the bootstrap capacitor 27. This partial discharge will result in the voltage at output node 31 being reduced to a level of less than a minimum binary up level voltage even though switching FET 23 was not rendered conductive by an input signal A.

Another difficulty with the use of an ordinary self-charging bootstrap capacitor circuit, such as shown in FIG. 2, it that two of such circuits cannot be connected in series to provide a higher gate voltage to a switching FET than one bootstrap capacitor bias circuit alone would be able to provide. Higher gate voltages are desirable to allow a relatively narrow field effect transistor to conduct more current. Referring to FIG. 3, two such ordinary self-charging bootstrap capacitor circuits have been connected in series. The circuit of FIG. 3 also uses clock phase signal to gate the FET devices as taught in U.S. Pat. Nos. 3,601,627 and 3,638,036 to reduce power dissipation. FET 45 and FET 43 provide a current path in series to charge bootstrap capacitor node 49 to +8 volts minus $Vth$. After bootstrap capacitor 47 has been charged, the clock pulse signal labeled $\phi 1$ returns to a ground reference voltage turning FET 43 and FET 45 off. In theory, when FET 43 turns off, node 51 is allowed to rise providing a series current path through FET 41 and FET 59 to charge capacitor 57 to a voltage substantially equal to +8 volts. When FET 59 is rendered nonconducting, however, the output node 61 does not rise to 8 volts but remains a full threshold $Vth$ below 8 volts because node 51 is clamped to 8 volts by FET 41 which still has a large positive voltage at its gate input node 49.

If the input to discharging FET 53 is connected to an input signal such as clock phase three, node 49 will be discharged at the same time as node 61 is allowed to rise, thereby turning off device 41. However, because of the voltage divider effect of capacitors 47 and 57, node 51 will be partially discharged and again a reduced output voltage will be generated.

SUMMARY OF THE INVENTION

It is an object of this invention to provide an improved bootstrap inverting circuit having reduced power dissipation.

It is a further object of this invention to incorporate the advantages of dynamic logic into a self-charging bootstrap capacitor inverting circuit.

It is an even further object of this invention to allow removal of bootstrapped bias voltage from the gate of a load FET without substantially reducing the output voltage provided by the load FET to a voltage level near or below a minimum binary up level.

It is a still further object of this invention to provide substantially increased bias voltage to a load FET device by connecting a plurality of self-charging bootstrap capacitor biased circuits in series.

These and other objects are obtained by incorporating a discharge device and an isolation device at the terminals of a bootstrap capacitor so as to allow the removal of bias voltage from the FET device acting as a load resistor without greatly affecting the binary up level voltage signal at the output.

PREFERRED EMBODIMENT OF THE INVENTION

Figure 4:
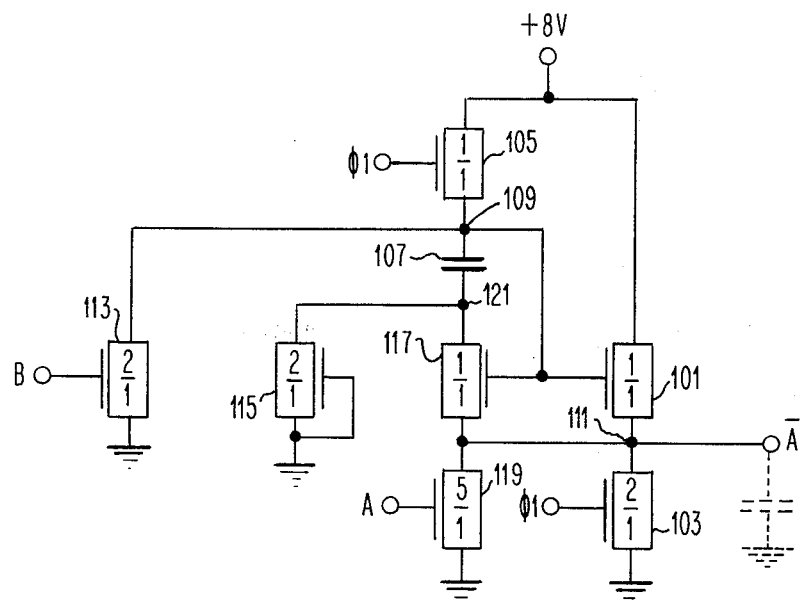
FIG. 4 shows an inverter incorporating the invention.

Referring to FIG. 4, a preferred embodiment of an inverter incorporating the invention is shown. Bootstrap capacitor 107 is connected in series with devices, FET 103, FET 117, and FET 105 via nodes 111, 121 and 109 to provide a charging current path whenever a phase one dynamic logic clock signal is present to render FET 103 and FET 105 conducting. FET 117 will also conduct under these circumstances because a positive voltage will appear at its gate from node 109 with respect to node 121.

In addition to the above recited field effect transistor devices, FET 101 has a channel region connected in series between the power supply and node 111. The gate of FET device 101 is connected to node 109. FET 101 acts as the load FET which is driven by the bootstrapped voltage at node 109 which is substantially above the power supply voltage of +8 volts to provide a binary up level output at node 111. FET device 119 is connected between node 111 and ground reference potential to provide a current discharge path from node 111 to ground thereby providing a binary zero level output signal at node 111 when FET 119 is conducting. FET 119 conducts when the minimum positive binary up level voltage signal A of at least +4 volts appears at its gate. In order to discharge node 109, a discharge FET 113 having a channel region connected in series between node 109 and ground reference potential is provided. Discharge FET 113 is rendered conductive by a binary up level voltage signal B of at least 4 volts.

In order to prevent node 121 from going to a substantially negative voltage as node 109 is discharged, clamp FET 115 having a channel region connected between node 121 and ground reference potential is provided. The gate of clamp FET 115 is also connected to ground reference potential so that FET 115 begins conducting whenever a negative voltage appears at node 121. Clamp FET 115 will not conduct when a positive voltage exists at node 121.

OPERATION OF THE PREFERRED EMBODIMENT

In order to provide a bias voltage substantially above the power supply voltage of +8 volts, bootstrap capacitor 107 must be first charged and then the voltage at node 121 must be raised. A charging current path is provided by FET 105, FET 117, and FET 103 during clock phase one. As FET 105 begins to conduct, node 109 is raised to a more positive level which acts on the gate of FET 117 to render FET 117 conducting.

When capacitor 107 has been charged and the clock phase one signal returns to ground reference level voltage, the output node 111 is allowed to rise to a more positive voltage if switching FET 119 is not conducting. Because node 109 is positive with respect to node 111, isolation FET 117 will remain conducting, thereby bootstrapping node 109 to a voltage substantially above the +8 volt supply. In preparation for allowing a fast discharge of output node 111 at some later time, discharge FET 113 is rendered conductive by a positive binary up level signal B of at least 4 volts to discharge node 109. As node 109 is discharged, the voltage at the gate of isolation FET 117 is reduced to a voltage level below that of node 111 rendering isolation FET 117 relatively nonconducting. Therefore, as node 109 is discharged, current is not drawn out of node 111 which remains at a valid binary up level voltage until discharged to a binary zero level by switching FET 119 when a positive binary up level signal A is provided at its gate.

ALTERNATE EMBODIMENT OF THE INVENTION

Figure 5:
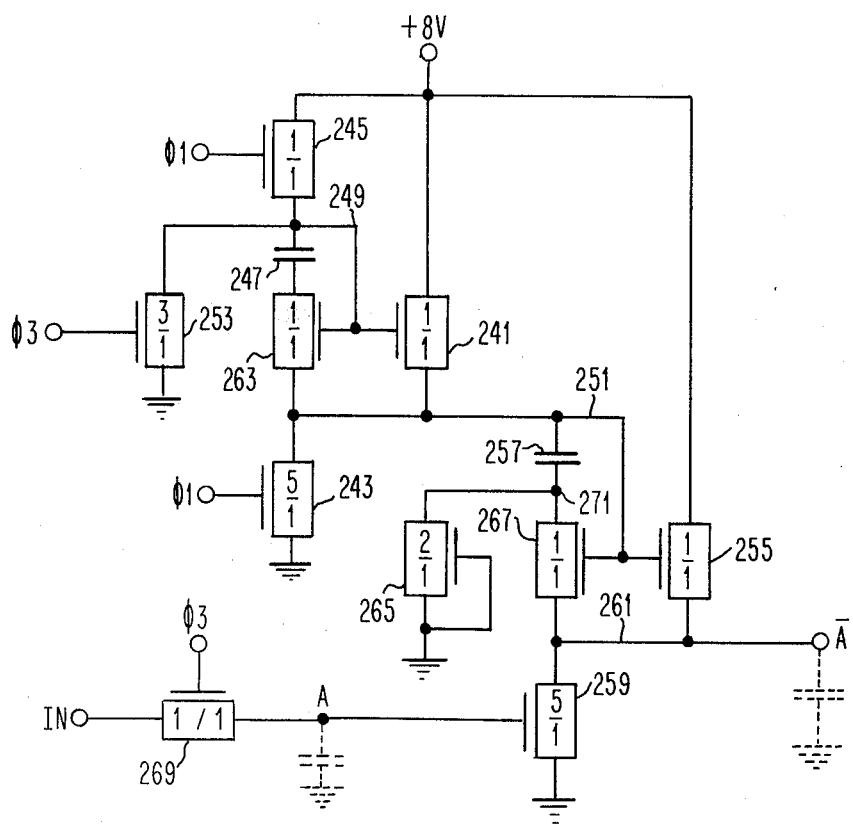
FIG. 5 shows two bootstrap bias circuits of the invention connected in series.

Referring now to FIG. 5, a plurality of the isolated bootstrap bias voltage circuits are shown connected in series to provide an increased bias voltage over that obtainable from a single bootstrap bias circuit. A first bootstrap capacitor 247 is connected in series via nodes 249 and 251 with FET 245, FET 243, and isolation FET device 263 which provide a charging current path to charge capacitor 247 during clock phase one. A second bootstrap capacitor 257 is provided with charging current via nodes 251 and 261 through FET device 241, isolation FET 267, and FET 259 during clock phase two.

In addition to the above recited field effect transistors, devices, the alternate embodiment of the invention includes load FET 241 having a channel region connected in series between the power supply voltage of +8 volts and node 251. The gate of FET 241 is connected to node 249. Discharge FET 253 has a channel region connected in series between node 249 and ground reference potential. The gate of FET 253 is connected to clock phase three signal input to render FET 253 conductive after the second bootstrap capacitor 257 has been charged. A second load FET 255 has a channel region connected between the +8 volt power supply and the output node 261. The gate of FET 255 is connected to node 251 for providing a relatively high current through FET 255 in response to the substantially higher voltage at node 251 thereby causing output node 261 to rise to a positive up level binary voltage in a very short time.

Switching FET 259 has a channel region connected between output node 261 and ground reference potential. The gate of FET 259 is connected via FET 269 to a randomly switched input signal IN to be inverted. Whenever the signal IN is a binary up level at clock phase three, a positive binary up level voltage signal labeled A renders FET 259 conductive and lowers the voltage at node 261 to a binary zero level. When IN is at a binary zero level at clock pulse three, signal A will become a binary zero level and the voltage at node 261 will be allowed to rise.

In order to prevent node 271 from going to a substantially negative voltage level when FET 243 is rendered conductive during clock phase one, clamp FET 265 has a channel region connected between node 271 and ground reference potential. The gate of FET 265 is also connected to ground reference potential so that FET 265 will only conduct when the voltage on node 271 becomes negative.

OPERATION OF THE ALTERNATE EMBODIMENT

Figure 6:
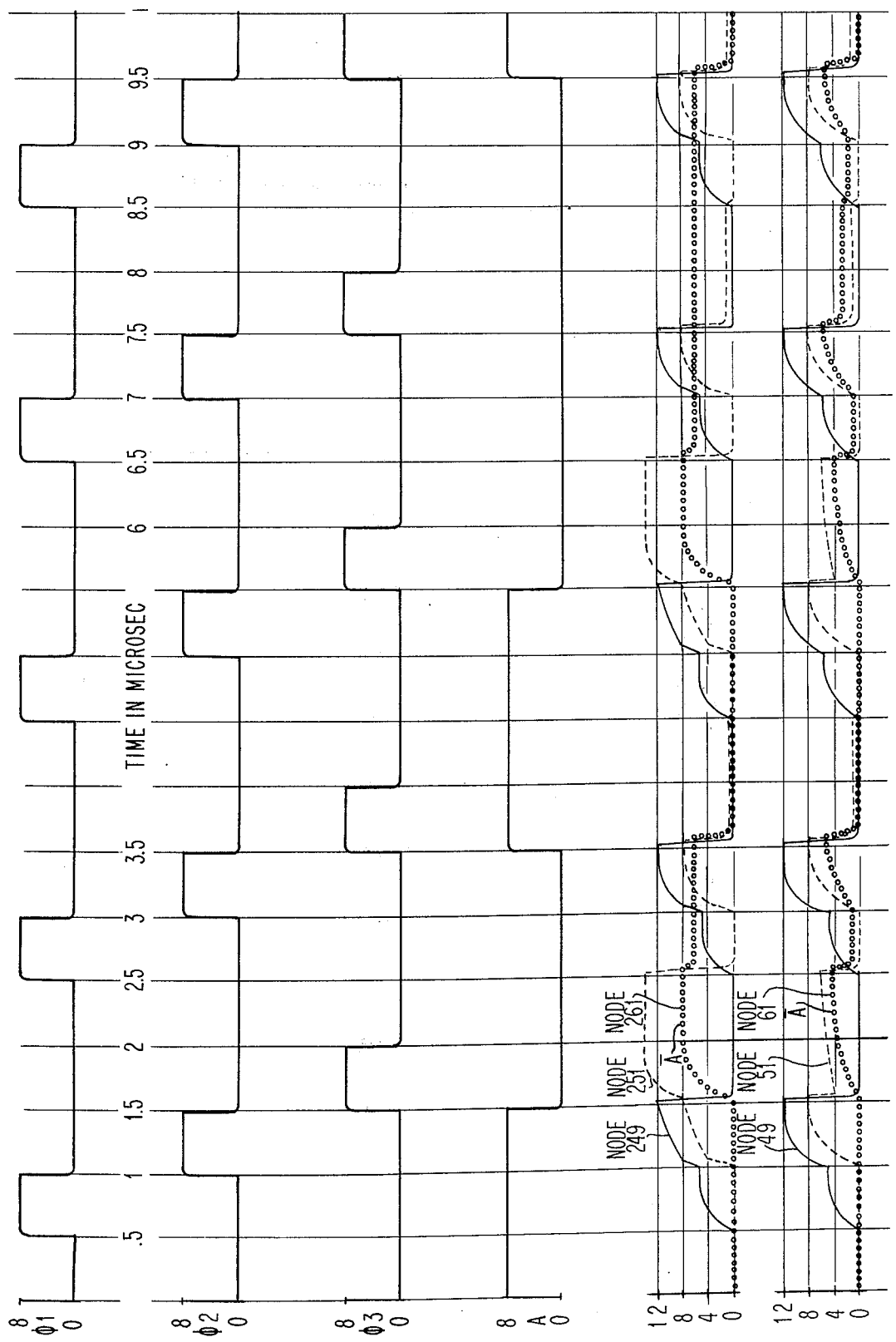

With reference to FIG. 6, wherein a plurality of voltage waveforms are shown, the operation of the circuit of FIG. 5 will be described. Five hundred nanoseconds after the beginning of the waveforms shown in FIG. 6, an 8 volt binary up level clock phase one signal is applied to the gates of FET 243 and FET 245 causing them to become conductive. As FET 245 begins to conduct, node 249 becomes positive with respect to node 251 causing FET 263 to also become conductive. The charging current through bootstrap capacitor 247 causes the voltage at node 249 to rise as shown by the waveform of FIG. 6 labeled NODE 249.

At one microsecond after time zero, the clock phase one signal returns to a binary zero voltage level and the clock phase two signal rises to +8 volts. If node 261 is at a binary zero voltage level, a positive binary up level voltage will have been stored on node A intrinsic circuit capacitance and FET 259 will still be conducting. If node 261 is at a binary up level indicating that FET 259 is in a nonconducting state, there will be no need to charge capacitor 257. A charging current path is thereby created through FET 259 during clock phase two to charge the second bootstrap capacitor 257 when node 261 is at a binary zero voltage level. FET 241 will conduct because, as shown in FIG. 6, the voltage at node 249 is approximately V$th$ volts greater than the voltage at node 251, depicted by the dashed waveform labeled NODE 251. Because the voltage at node 249 remains above the voltage at node 251, FET 263 remains conducting thereby allowing bootstrap capacitor 247 to operate to provide a rising bootstrap bias voltage to FET 241. NODE 249 rises to substantially above 8 volts, namely, to 12 volts as bootstrap capacitor 257 is charged by current flowing through FET 241.

At one and a half microseconds from time zero, node 251 has been charged to its maximum value of +8 volts and cannot be further charged from the +8 volt power supply. At 1½ microseconds after time zero, the first clock phase three signal is raised to +8 volts. In this example of FIG. 6, signal A becomes a binary zero voltage level at clock phase three which renders FET 259 nonconducting and allows the voltage at output node 261 to begin to rise as shown by the dotted wavefom identified as NODE 261 as well as $\overline{A}$. Simultaneously as the voltage at node 261 begins to rise, the clock phase three input signal to FET 253 discharges node 249 to render both FET 263 and FET 241 nonconducting, thereby allowing the voltage at node 251 to rise above +8 volts. As shown in FIG. 6, the voltage at node 251 is bootstrapped to substantially above 12 volts while FET 255 provides charging current to node 261 to charge the output net capacitance. Note that, although the width to length ratio of FET 225 is the same as that of FET 241, and, therefore, these transistors occupy the same physical space on an integrated circuit, the voltage at node 261 rises substantially faster during clock phase three as compared with the rise in voltage at node 251 during clock phase two, although both of these transistors are connected to the same power supply. The difference in performance is due to the fact that FET 225 is driven with a gate voltage bootstrapped up from 8 volts to in excess of 12 volts whereas FET 241 is driven with a gate voltage bootstrapped up to only 12 volts from the value of 8 volts minus V$th$. By clock phase four at 2 microseconds, the output $\overline{A}$ at node 261 has fully risen to the maximum binary up level voltage of 8 volts.

During the second clock phase one from 2½ to 3 microseconds, bootstrap capacitor 247 is again charged requiring the voltage at node 251 to be reduced to zero volts in order to provide a charging path through capacitor 247. The drop in voltage at node 251 does not greatly affect the output voltage at node 261, however, because as the voltage at node 251 begins to drop below 8 volts, isolation FET 267 becomes nonconducting to prevent the charge at node 261 from being coupled off through bootstrap capacitor 257 to ground by voltage divider action between bootstrap capacitor 257 and the distributed net capacitance of output node 261. Because FET 267 will remain slightly conductive during that short period of time while the voltage at node 251 is dropping below +8 volts, a small dip in the voltage at node 261 is observed to occur between 2½ and 3 microseconds after time zero as shown in FIG. 6. This small dip in voltage does not bring the output voltage below a minimum binary uplevel of 4 volts, however, and, therefore, a reliable $\overline{A}$ signal remains present at the output node 261.

During clock phase 2 at 3 microseconds from time zero, node 251 is again charged to +8 volts. It will be noted that the waveforms of the voltages at node 251 and at node 249 differ slightly between 3 and 3½ microseconds after time zero as compared with the same waveforms between 1 and 1½ microseconds after time zero. The difference in wave shapes occur because, between 1 and 1½ microseconds, capacitor 257 is being charged with current which flows through FET 259. On the other hand, between 3 and 3½ microseconds after time zero, signal A is at a binary zero level voltage and FET 259 is not conducting so that no charging current flows through bootstrap cafpacitor 257. Therefore, node 251 rises much faster since the only charging current provided by FET 241 is that charging current necessary to charge intrinsic circuit capacitances.

At clock phase three, 3½ microseconds after time zero, however, signal A rises to a binary uplevel voltage rendering FET 259 conductive again to cause the signal $\overline{A}$ at node 261 to drop to a binary zero level voltage and remain at that voltage level during clock phases three and four. As shown in FIG. 6, the waveforms NODE 249, NODE 251 and NODE 261 repeat themselves between 4½ and 7½ microseconds after time zero. At clock phase three, 7½ microseconds after time zero, the waveform NODE 261 does not drop as it did 3½ microseconds after time zero because the signal A does not rise to a binary uplevel voltage and, therefore, FET 259 does not become conductive.

Figure 1:
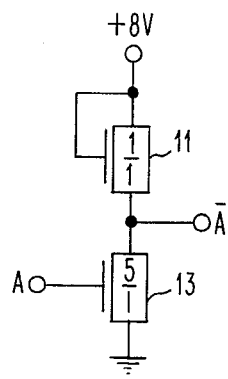
FIG. 1 shows a prior art inverter.
Figure 2:
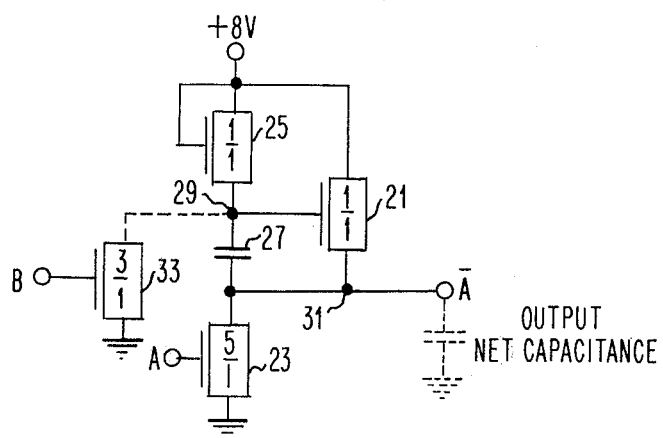
FIG. 2 shows a prior art inverter with a bootstrap bias circuit.
Figure 3:
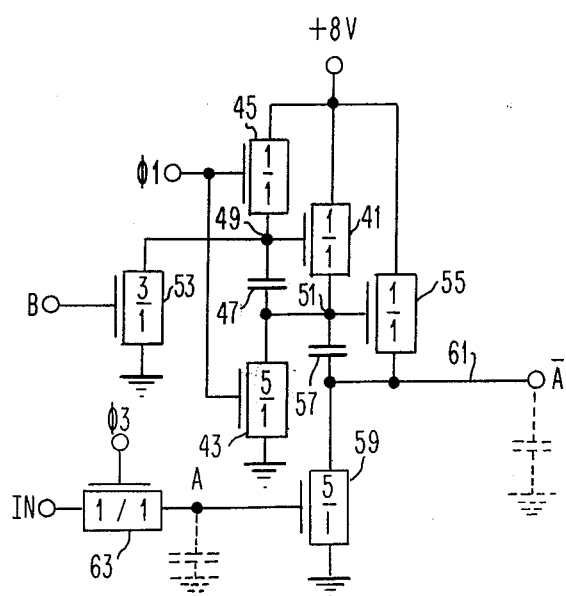
FIG. 3 shows two prior art bootstrap biased circuits connected in series.

In order to provide a better understanding of the operation of the alternate embodiment of the invention of FIG. 5, the waveforms labeled NODE 49, NODE 51 and NODE 61 are shown in FIG. 6 which depict the voltages as a function of time at nodes 49, 51 and 61 of FIG. 3. Each bootstrap capacitor biased circuit of FIG. 3 is an ordinary bootstrap bias circuit as shown in FIG.

2. Note that the waveform NODE 51 is substantially discharged at phase three, 1½ microseconds after time zero as node 49 is being discharged. As previously explained, node 49 must be discharged in order to allow FET 41 to be rendered nonconducting so that node 51 can rise above +8 volts. In comparison, the waveform NODE 251 rises by bootstrap action to a voltage substantially above 12 volts during this same clock phase three time. Because the voltage at node 51 does not rise, but is instead substantially discharged to a bare minimum up level voltage of approximately 4 volts, the waveform of NODE 61 rises very slowly, in fact, slower than it would have been allowed to rise if only a single bootstrap circuit were employed. Therefore, the object of connecting two bootstrap biased circuits in series to increase rise time is shown to be impractical unless the isolation devices of the invention are incorporated into the bootstrap bias circuit.

While the invention has been shown and described with respect to a perferred embodiment and an alternate embodiment thereof, it will be recognized by those skilled in the art that various changes in form and detail may be made in the embodiment of the invention without departing from the spirit and scope thereof. For example, although the described embodiments utilize N-channel enhancement field effect transistor devices, which operate from a positive voltage supply and become conducting under the influence of a positive voltage signal at their control gate, devices which are the equivalent of the described field effect transistor devices may be interchanged therewith by one of ordinary skill in the art of circuitry design while practicing the invention.

What is claimed is:

1. An improved bootstrap bias circuit comprising:
   a device connected between a voltage source and a first circuit node for charging a capacitor;
   said capacitor having a first conducting surface connected to said first circuit node;
   a load device connected between said voltage source and a second circuit node for charging the capacitance of said second node;
   a control gate of said load device being connected to said first node;
   a discharge device connected between a reference voltage source and said first node for discharging said first node;
   an isolation device connected between a second conductive surface of said capacitor and said second node, said isolation device having a control gate connected to said first node for controlling said isolation device to prevent substantial discharge of said second node while said first node is being discharged;
   a switching device connected between said reference voltage source and said second node for discharging said capacitance of said second node to complete a current path for charging said capacitor.

2. The circuit of claim 1 wherein said load device, said isolation device, said switching device, and said discharge device are each a field effect transistor.

3. The circuit of claim 2 wherein said capacitance of said second node is a second capacitor having a first conductive surface connected to said node, further comprising:
   a second load field effect transistor connected between said voltage source and a third node for charging a capacitance of said third node;
   a second isolation field effect transistor connected between a second conducting surface of said second capacitor and said third node, said second isolation field effect transistor having a control gate connected to said second node for controlling said second isolation field effect transistor to prevent substantial discharage of said third node while said second node is being discharged by said switching field effect transistor;
   a second switching field effect transistor connected between said reference voltage source and said third node for discharging said capacitance of said third node to complete a current path for charging said second capacitor.

4. The circuit of claim 3 further comprising:
   a clamp field effect transistor connected between said reference voltage source and said second conductive surface of said second capacitor for preventing said second conductive surface of said second capacitor from assuming a voltage polarity substantially opposite to a voltage on said first conductive surface of said capacitor with respect to said reference voltage.

5. The circuit of claim 1 further comprising:
   a clamp device connected between said reference voltage source and said second conducting surface of said capacitor for preventing said second conducting surface of said capacitor from assuming a voltage polarity substantially opposite to a voltage on said first conductive surface of said capacitor with respect to said reference voltage.

6. The circuit of claim 5 wherein said load device, said isolation device, said switching device, said discharge device, said said clamp device are each the field effect transistor.

7. A bootstrap bias circuit of the type having a capacitor connected between a first terminal of a load device and a control gate of said load device for providing increased bias voltage to said control gate of said load device as the voltage at said first terminal is caused to rise by said load device, wherein the improvement comprises:
   an isolation device connected in series with said capacitor;
   said isolation device having a first terminal connected to said first terminal of said load device and a control gate connected to said control gate of said load device, said control gate of said isolation device causing said isolation device to become non-conducting as said bias voltage at said control gate of said load device is lowered;
   whereby said isolation device prevents substantial discharge of the capacitance of said first terminal through said capacitor.

8. The boot strap bias circuit of claim 7 wherein the improvement further comprises:
   a clamp device connected between a reference voltage source and a second terminal of said isolation device for preventing said terminal of said isolation device from assuming a voltage polarity substantially opposite to a voltage at said control gates with respect to said reference voltage.

* * * * *